(12) United States Patent
Xiao (10) Patent No.: US 8,940,640 B2
(45) Date of Patent: Jan. 27, 2015

(54) SOURCE/DRAIN STRUCTURE OF SEMICONDUCTOR DEVICE

(71) Applicant: Taiwan Semiconductor Manufacturing Company, Ltd., Hsin-Chu (TW)

(72) Inventor: Ying Xiao, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/927,580

(22) Filed: Jun. 26, 2013

(65) Prior Publication Data

US 2014/0264445 A1 Sep. 18, 2014

Related U.S. Application Data (60) Provisional application No. 61/780,271, filed on Mar. 13, 2013.

(51) Int. Cl.
*H01L 21/311* (2006.01)
*H01L 29/78* (2006.01)
*H01L 29/66* (2006.01)

(52) U.S. Cl.
CPC ...... *H01L 29/7848* (2013.01); *H01L 29/66431* (2013.01); *H01L 29/66477* (2013.01)
USPC .................. 438/700; 438/689; 257/E21.215; 257/E21.219; 257/E21.222

(58) Field of Classification Search
CPC ................... H01L 21/30604; H01L 21/3086; H01L 21/0337
USPC .................. 438/689, 694, 700, 706, 745; 257/E21.215, 219, 222
See application file for complete search history.

(56) References Cited

U.S. PATENT DOCUMENTS

| | | | | |
|---|---|---|---|---|
| 5,843,820 | A * | 12/1998 | Lu .................................. | 438/243 |
| 8,575,653 | B2 * | 11/2013 | Rachmady et al. ........... | 257/192 |
| 8,598,003 | B2 * | 12/2013 | Murtthy et al. ............... | 438/300 |
| 2002/0195423 | A1 * | 12/2002 | Patel et al. ..................... | 216/73 |
| 2006/0205190 | A1 * | 9/2006 | Chi et al. ....................... | 438/507 |
| 2006/0234504 | A1 * | 10/2006 | Bauer et al. ................... | 438/674 |
| 2013/0069172 | A1 * | 3/2013 | Liao et al. ..................... | 257/408 |
| 2013/0264635 | A1 * | 10/2013 | Park .............................. | 257/329 |
| 2014/0124904 | A1 * | 5/2014 | Liao et al. ..................... | 257/655 |

\* cited by examiner

*Primary Examiner* — Eduardo A Rodela
(74) *Attorney, Agent, or Firm* — Slater & Matsil, L.L.P.

(57) ABSTRACT

The disclosure relates to a semiconductor device. An exemplary structure for a field effect transistor comprises a substrate comprising a major surface and a cavity below the major surface; a gate stack on the major surface of the substrate; a spacer adjoining one side of the gate stack; a shallow trench isolations (STI) region disposed on the side of the gate stack, wherein the STI region is within the substrate; and a source/drain (S/D) structure distributed between the gate stack and STI region, wherein the S/D structure comprises a strained material in the cavity, wherein a lattice constant of the strained material is different from a lattice constant of the substrate; and a S/D extension disposed between the substrate and strained material, wherein the S/D extension comprises a portion extending below the spacer and substantially vertical to the major surface.

20 Claims, 12 Drawing Sheets

SOURCE/DRAIN STRUCTURE OF SEMICONDUCTOR DEVICE

This application claims priority to U.S. Provisional Application Ser. No. 61/780,271, filed on Mar. 13, 2013, entitled "Source/Drain Structure of Semiconductor Device," which application is hereby incorporated herein by reference.

TECHNICAL FIELD

The disclosure relates to integrated circuit fabrication, and more particularly to a semiconductor device with a source/drain structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, non-uniform dopants distribution of S/D extensions causes fluctuation of FinFET characteristics such as breakdown effect and leakage, thereby degrading the device performance. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
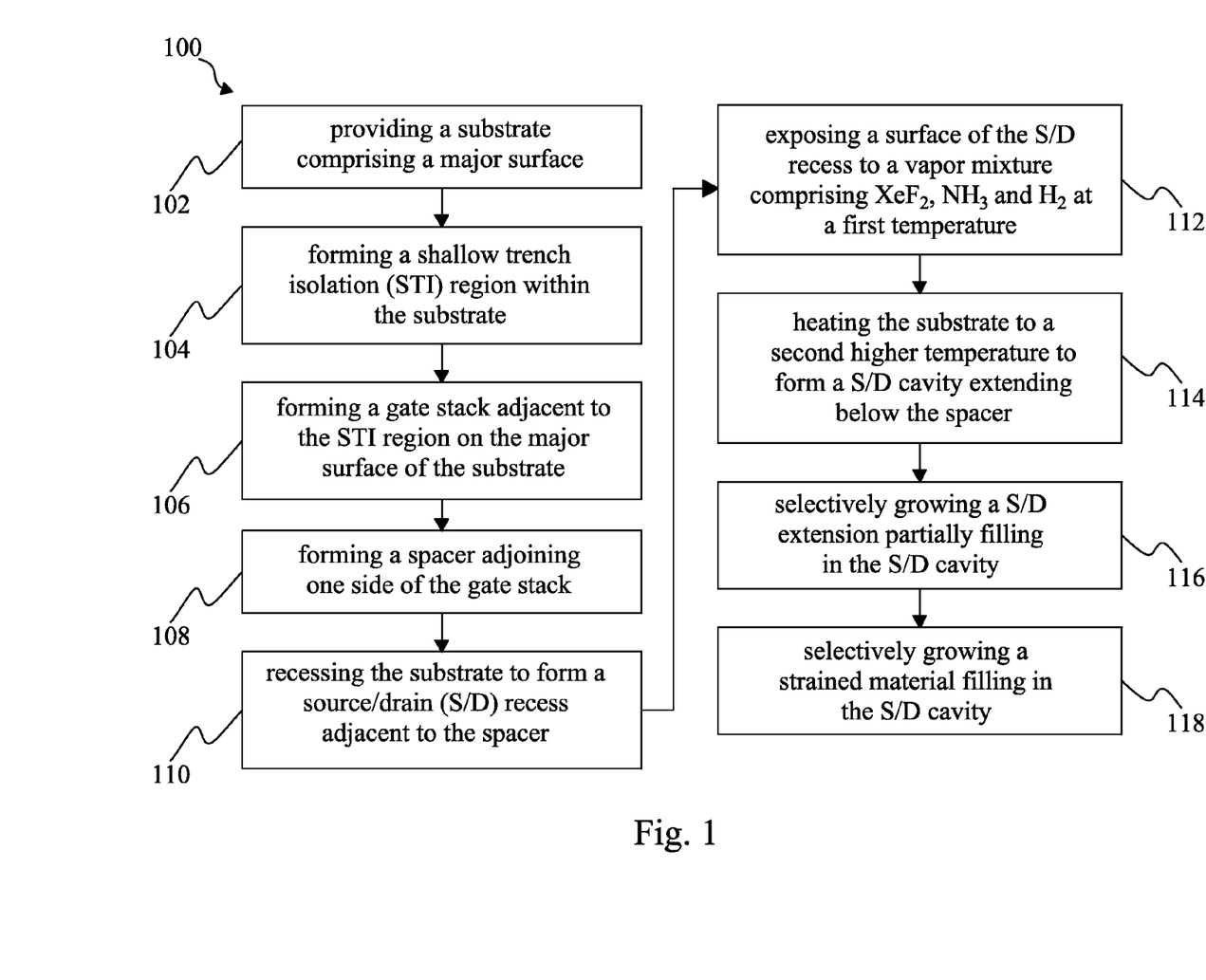
FIG. 1 is a flowchart illustrating a method of fabricating a source/drain structure of a semiconductor device according to various aspects of the present disclosure.

Referring to FIG. 1, illustrated is a flowchart of a method 100 of fabricating a source/drain (S/D) structure of a semiconductor device according to various aspects of the present disclosure. The method 100 begins with step 102 in which a substrate comprising a major surface is provided. The method 100 continues with step 104 in which a shallow trench isolation (STI) region is formed within the substrate. The method 100 continues with step 106 in which a gate stack adjacent to the STI region is formed on the major surface of the substrate. The method 100 continues with step 108 in which a spacer adjoining one side of the gate stack is formed.

The method 100 continues with step 110 in which the substrate is recessed to form a S/D recess adjacent to the spacer. The method 100 continues with step 112 in which a surface of the S/D recess is exposed to a vapor mixture comprising $XeF_2$, $NH_3$ and $H_2$ at a first temperature. The method 100 continues with step 114 in which the substrate is heated to a second higher temperature to form a S/D cavity extending below the spacer. The method 100 continues with step 116 in which a S/D extension is selectively grown partially filling in the S/D cavity. The method 100 continues with step 118 in which a strained material is selectively grown filling in the S/D cavity. The discussion that follows illustrates embodiments of semiconductor devices that can be fabricated according to the method 100 of FIG. 1.

FIGS. 2-12 are cross-sectional views of a semiconductor device 200 comprising a source/drain (S/D) structure 250 at various stages of fabrication according to various embodiments of the present disclosure. As employed in the present disclosure, the term semiconductor device 200 refers to a fin field effect transistor (FinFET) 200. The FinFET 200 refers to any fin-based, multi-gate transistor. In some embodiments, the term semiconductor device 200 refers to a planar metal-oxide-semiconductor field effect transistor (MOSFET). Other transistor structures and analogous structures are within the contemplated scope of the disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2:
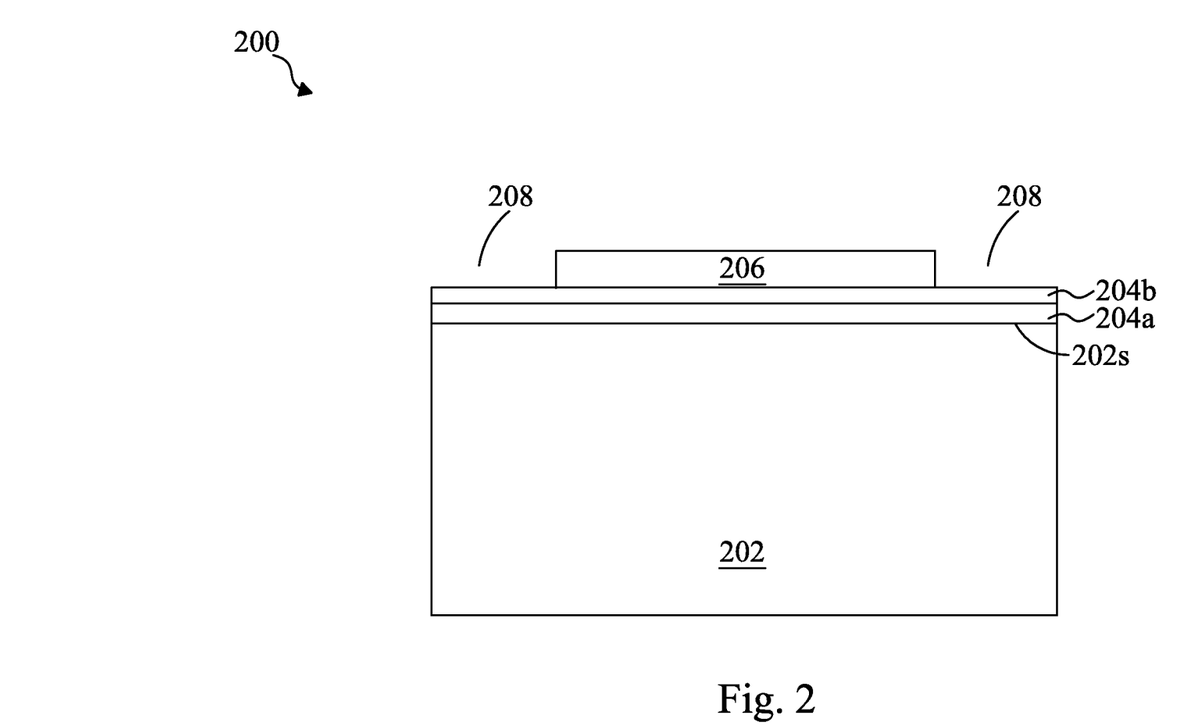
FIGS. 2-12 are cross-sectional views of a semiconductor device comprising a source/drain structure at various stages of fabrication according to various embodiments of the present disclosure.

Referring to FIG. 2 and step 102 in FIG. 1, a substrate 202 comprising a major surface 202s is provided. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on the major surface 202s of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3:
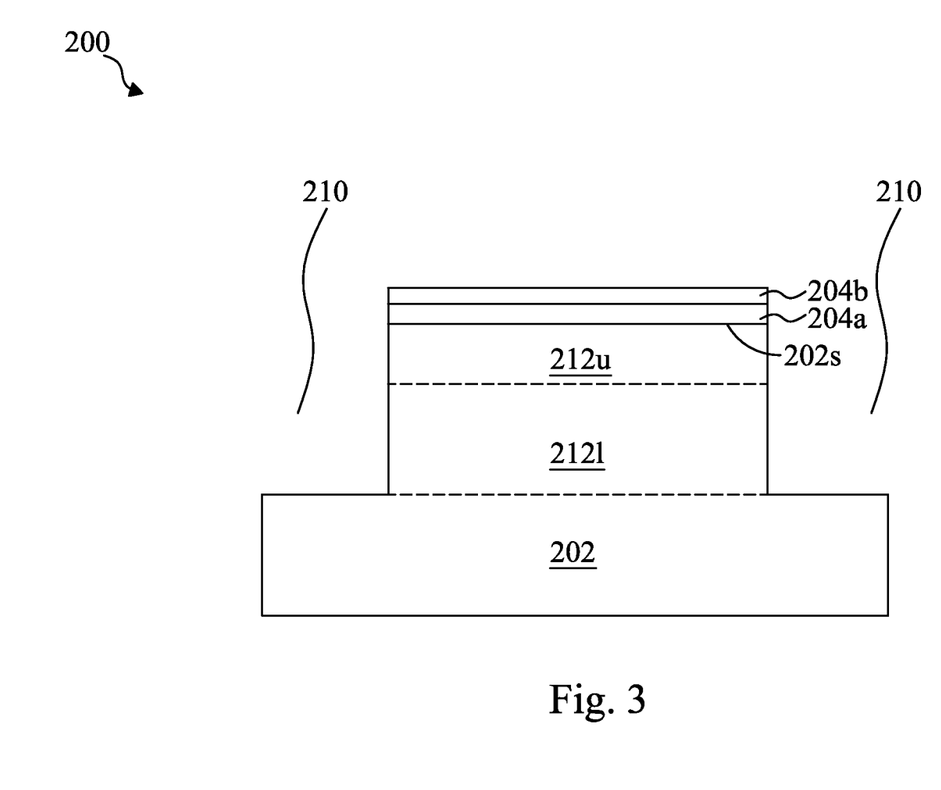
Figure 4:
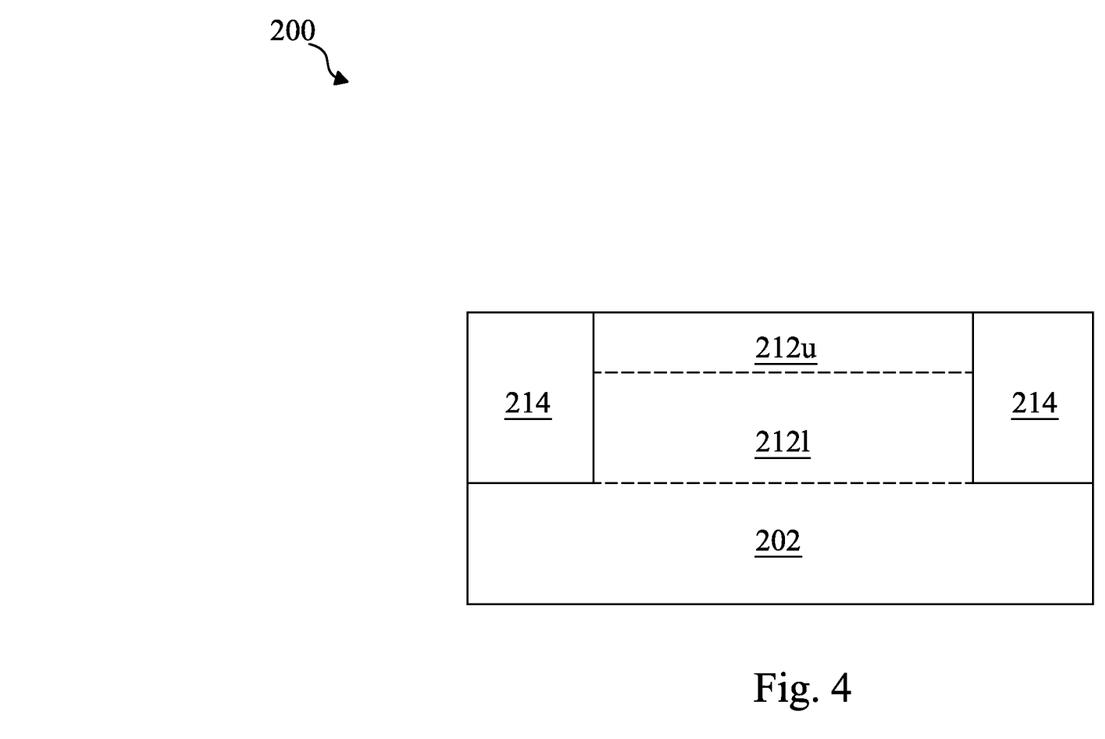
Figure 5:
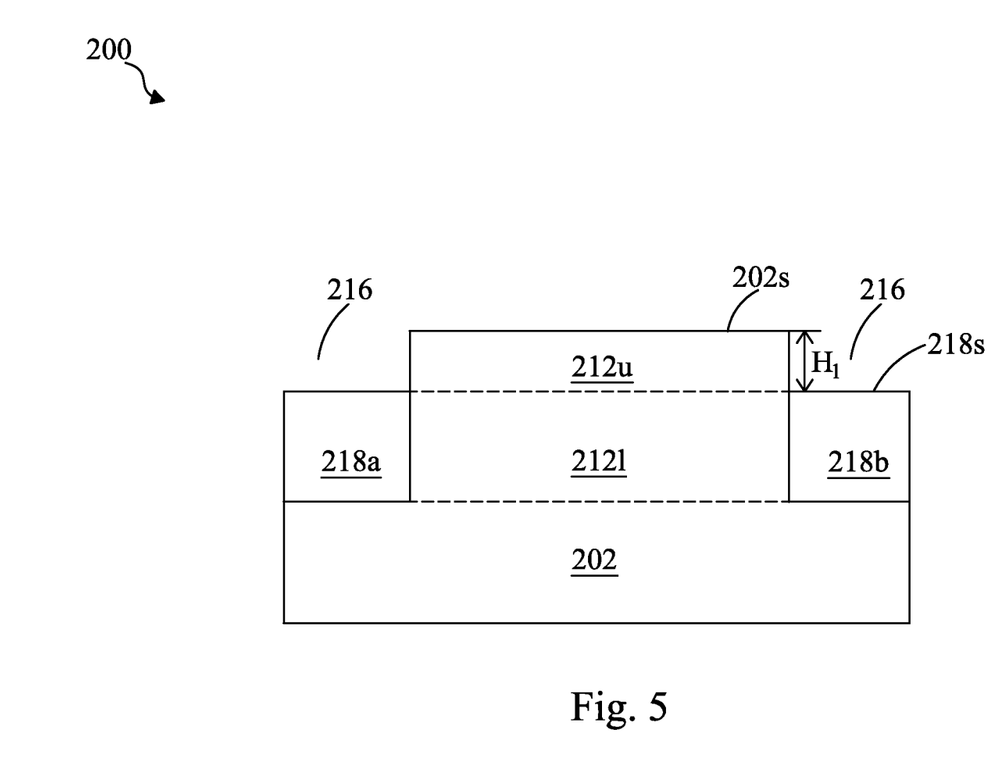

As depicted in FIGS. 3-5, and step 104 in FIG. 1, for forming a shallow trench isolation (STI) region 218 within the substrate 202, the structure in FIG. 3 is produced by forming a fin 212 in the substrate 202. The mask layer 204b and pad layer 204a are etched through openings 208 to expose underlying semiconductor substrate 202. The exposed semiconductor substrate 202 is then etched to form trenches 210 lower than the major surface 202s of the semiconductor substrate 202. In the depicted embodiment, for simplicity, portion of the semiconductor substrate 202 between trenches 210 form one semiconductor fin 212. In some embodiments, the FinFET 200 may comprise more than one fin, for example, three fins or five fins. In the depicted embodiment, the semiconductor fin 212 comprises an upper portion 212u and a lower portion 212l (separated by the dashed line). In some embodiments, the upper portion 212u and the lower portion 212l comprise a same material, such as silicon. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

FIG. 4 depicts the resulting structure after the deposition of a dielectric material 214, followed by a chemical mechanical polish (CMP) process. Trenches 210 are filled with the dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

In some embodiments, the mask layer 204b and pad layer 204a are removed after the CMP process. In one embodiment, the mask layer 204b is formed of silicon nitride, the mask layer 204b may be removed using a wet process using hot $H_3PO_4$, while pad layer 204a may be removed using diluted HF acid, if formed of silicon oxide. In some embodiments, the removal of the mask layer 204b and pad layer 204a may be performed after the recessing of the oxide 214, which recessing step is shown in FIG. 5.

In some embodiments, the upper portion 212u of the fin 212 is replaced by other semiconductor material to enhance device performance. Using the oxide 214 as a hard mask, the upper portion 212u of the fin 212 is recessed by an etching step. Then a different material such as Ge is epi-grown to fill the recessed portion. In the depicted embodiment, the upper portion 212u of the fin 212 is a material such as Ge and lower portion 212l of the fin 212 is a material such as Si, comprising a different material.

After the removal of the mask layer 204b and pad layer 204a, the oxide 214 is recessed by an etching step to expose the upper portion 212u of the fin 212, resulting in recesses 216 and a remaining oxide 214 (shown in FIG. 5). The remaining portions of the oxide 214 in the trenches 210 are hereinafter referred to as the STI region 218. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

In the depicted embodiment, the upper portion 212u of the fin 212 extends downward from the substrate major surface 202s to a top surface 218s of the STI region 218 to a first height $H_1$. The first height $H_1$ may be between 15 nm and about 50 nm, although it may also be greater or smaller. In the depicted embodiment, the upper portion 212u comprises source/drain (S/D) portions and a channel portion between the S/D portions. The channel portion is used to form channel region of the semiconductor device 200.

Figure 6:
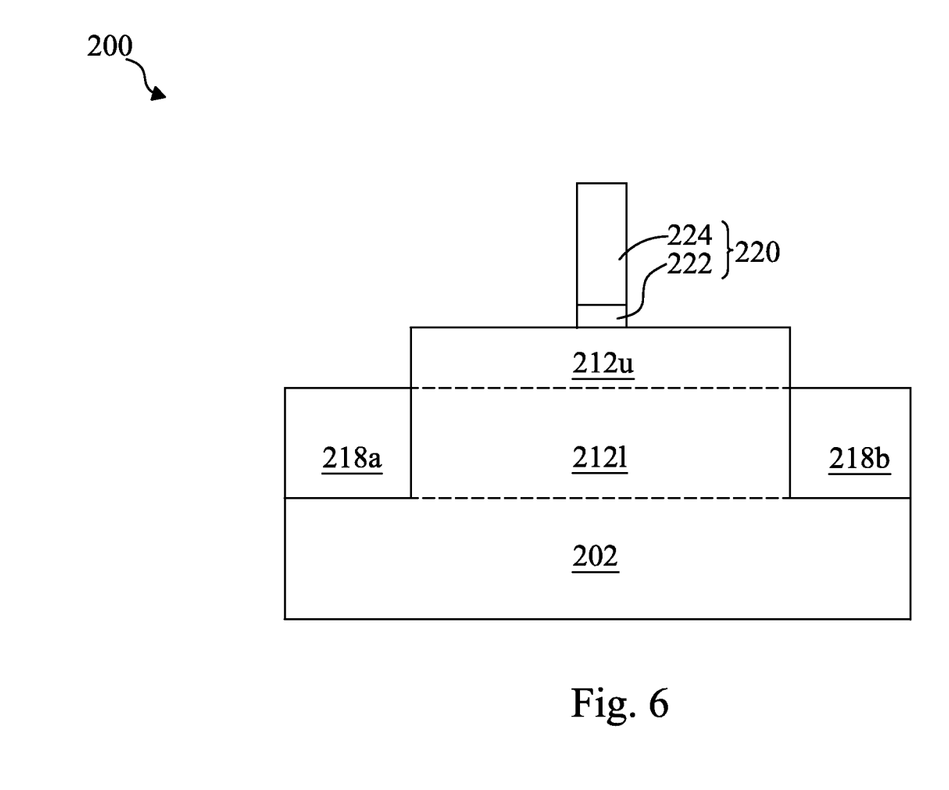

Referring to FIG. 6 and step 106 in FIG. 1, after formation of the STI region 218 within the substrate 202, the structure in FIG. 6 is produced by forming a gate stack 220 adjacent to the STI region 218 on the major surface 202s of the substrate 202. As such, the STI region 218a is disposed on one side of the gate stack 220, while the STI region 218b is disposed on another side of the gate stack 220. In some embodiments, the gate stack 220 comprises a gate dielectric layer 222 and a gate electrode layer 224 over the gate dielectric layer 222.

As depicted in FIG. 6, the gate dielectric layer 222 is formed to cover the channel portion of the upper portion 212u. In some embodiments, the gate dielectric layer 222 may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 222 is a high-k dielectric layer with a thickness in the range of about 10 Å to about 30 Å. The gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 222 may further comprise an interfacial layer (not shown) to reduce damage between the gate dielectric layer 222 and channel portion of the upper portion 212u. The interfacial layer may comprise silicon oxide.

The gate electrode layer 224 is then formed on the gate dielectric layer 222. In some embodiments, the gate electrode layer 224 may comprise a single layer or multilayer structure. In some embodiments, the gate electrode layer 224 may include poly-silicon or amorphous silicon. In some embodiments, the gate electrode layer 224 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 224 comprises a thickness in the range of about 60 nm to about 100 nm. The gate electrode layer 224 may be formed using a suitable process such as ALD, CVD, PVD, plating, or combinations thereof.

The process steps up to this point have provided the substrate 202 having the gate stack 220 on the major surface 202s of the substrate 202. Conventionally, S/D doping profile of a S/D structure may be altered using a lightly doped drain (LDD) implantation. By introducing the LDD region (i.e., S/D extension), peak electric field in a space charge region is reduced and breakdown and hot electron effects are minimized. However, non-uniform dopants distribution of the S/D extension on a top surface and sidewalls of the fin 212 cause fluctuation of FinFET characteristics such as breakdown effect and leakage, thereby degrading the device performance.

Accordingly, the processing discussed below with reference to FIGS. 7-12 may form a S/D structure comprising a S/D extension with uniform dopants distribution to replace the LDD region (i.e., S/D extension) with non-uniform dopants distribution. Problems associated with fluctuation of FinFET characteristics due to non-uniform dopants distribution of S/D extension may be avoided. Thus, Applicant's method may achieve the device performance characteristics, such as breakdown effect and leakage.

Figure 7:
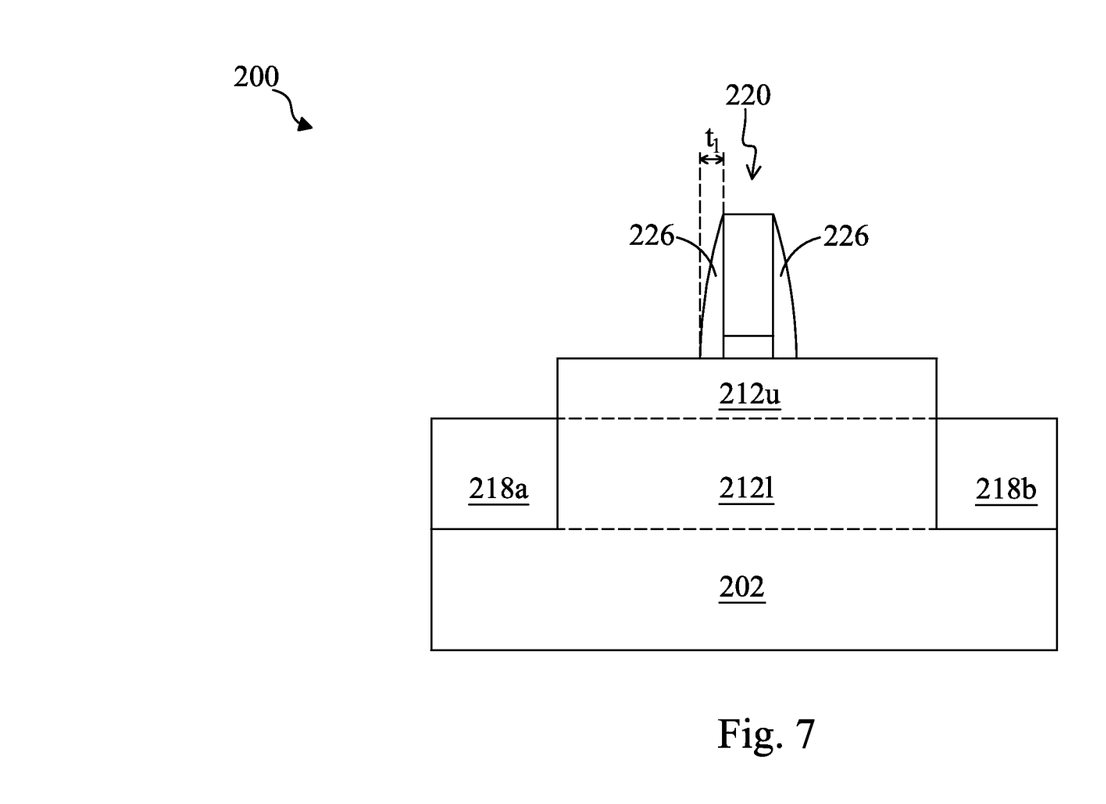

As depicted in FIG. 7 and step 108 in FIG. 1, for fabricating a S/D extension (such as a S/D extension 230 shown in FIGS. 11 and 12) with uniform dopants distribution of the semiconductor device 200, the structure in FIG. 7 is produced by forming a spacer 226 adjoining one side of the gate stack 220 (step 108 in FIG. 1). In some embodiments, the spacer 226 may include silicon oxide, silicon nitride, silicon oxy-nitride, or other suitable material. The spacer 226 may comprise a single layer or multilayer structure. In the depicted embodiment, a blanket layer of a dielectric layer may be formed over the gate stack 220 by CVD, PVD, ALD, or other suitable technique. Then, an anisotropic etching is performed on the dielectric layer to form a pair of spacers 226 on two sides of the gate stack 220. The spacer 226 comprises a first thickness $t_1$ ranging from about 5 nm to about 15 nm. In some embodiments, spacer 226 is formed on only one side of gate stack 220, resulting in an asymmetrical structure.

Figure 8:
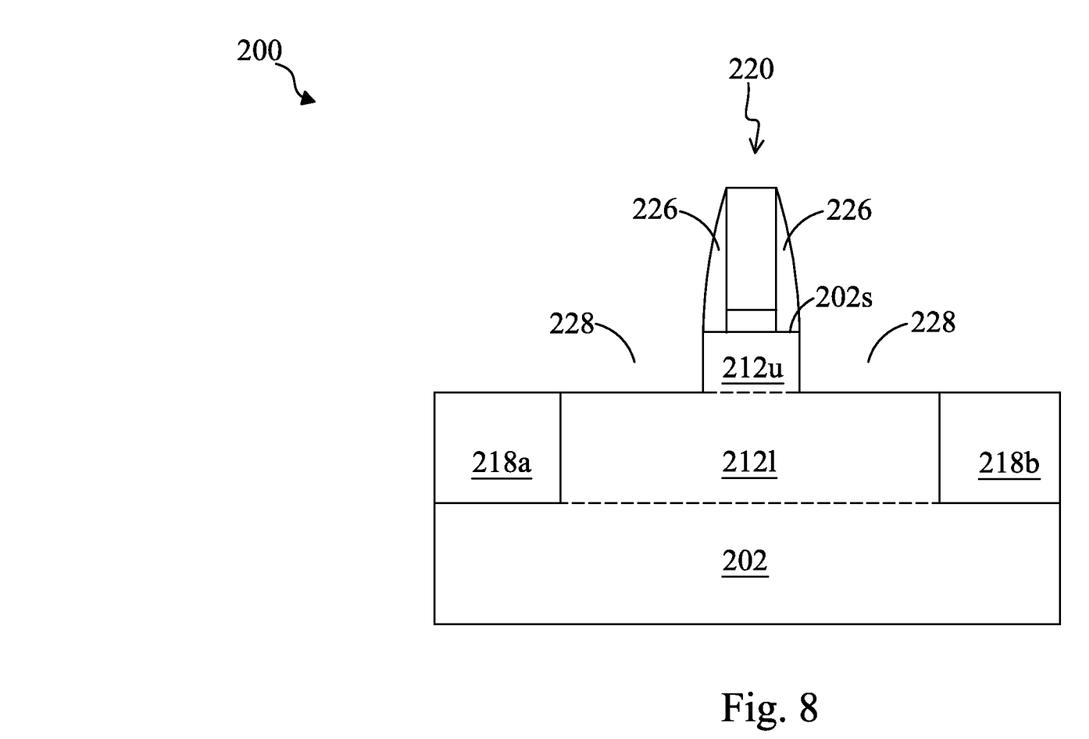

Referring to FIG. 8 and step 110 in FIG. 1, subsequent to formation of the spacer 226 adjoining one side of the gate stack 220, the structure in FIG. 8 is produced by recessing the substrate 202 to form a S/D recess 228 adjacent to the spacer 226. Using the gate stack 220 and the pair of spacers 226 as hard masks, an anisotropic plasma etching process is performed to recess the S/D portions of the upper portion 212u that are unprotected or exposed to form the S/D recesses 228 below the major surface 202s. In some embodiments, the etching process may be performed using a chemical selected from $Cl_2$, HBr, $NF_3$, $CF_4$, and $SF_6$ as an etching gas. One skilled in the art will recognize that a symmetrical structure can be formed, as depicted in FIG. 8, by forming a gate spacer on each side of gate stack 220. In other embodiments, an asymmetrical structure can be formed by forming a gate stack on only one side of gate stack 220. All such embodiments are within the contemplated scope of the present disclosure.

Figure 9:
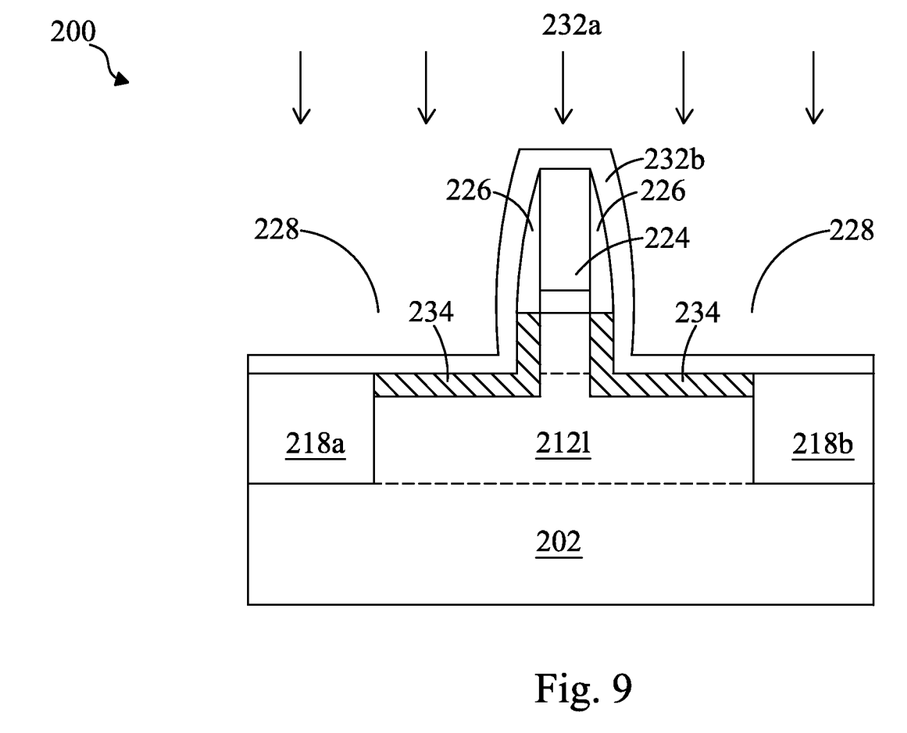
Figure 10:
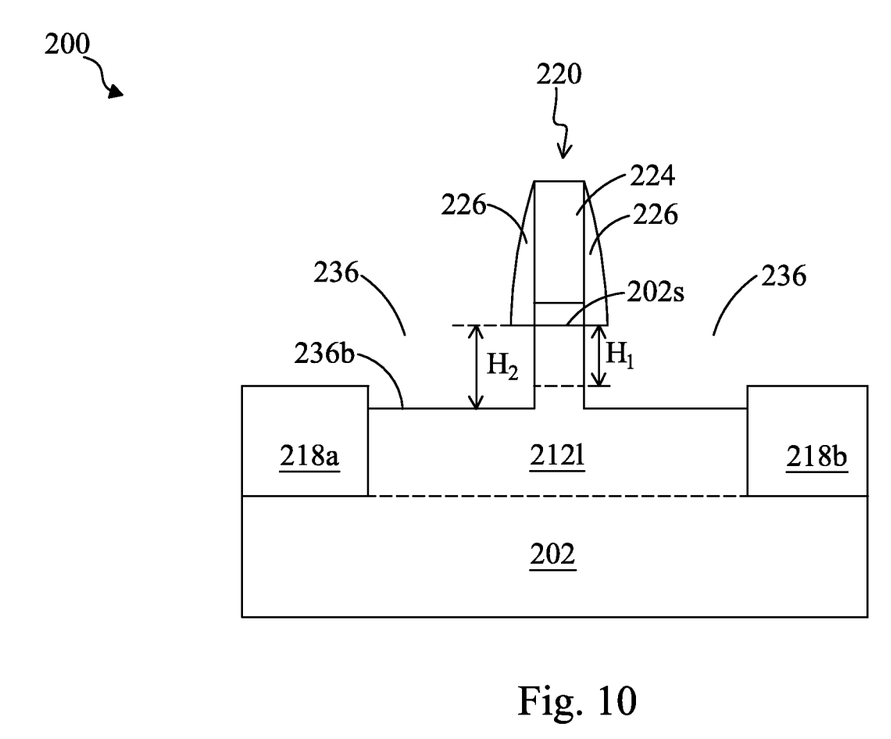
Figure 11:
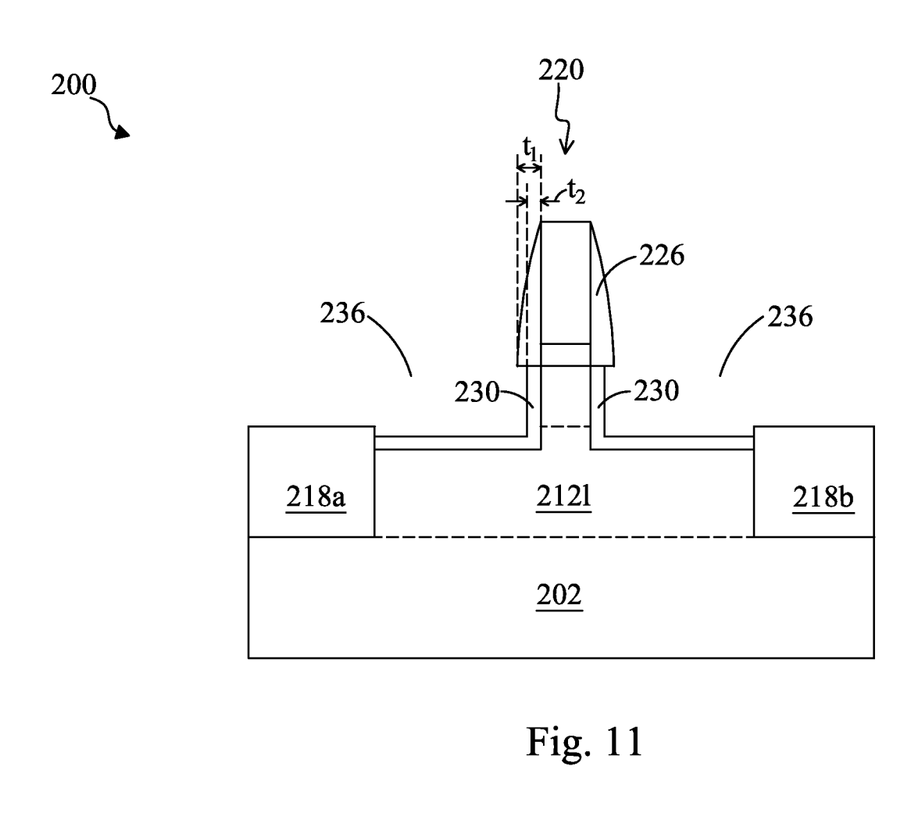

Subsequent CMOS processing steps applied to the semiconductor device 200 of FIG. 8 comprise forming the S/D extension 230 (see FIG. 12) extending below the spacer 226 to provide electrical contacts to channel region of the semiconductor device 200. As depicted in FIGS. 9-11 and steps 112-116 in FIG. 1, after formation of the S/D recess 228 adjacent to the spacer 226, the substrate 202 is further recessed to form a S/D cavity 236 (see FIG. 10) extending below the spacer 226 by a vapor phase etching process, as explained in more detail below.

The vapor phase etching process starts with introducing the structure of FIG. 8 into a sealed reaction chamber in which the vapor phase etching process uses gas phase reactants. The etching process is isotropic and self-limiting, in that the amount of material removed is determined by a threshold thickness of nonvolatile etch byproduct that would block any further chemical reaction between the gas phase reactants and the exposed surface of the S/D recess. In some embodiments, the vapor phase etching process employed in the present invention comprises exposing a surface of the S/D recess 228 to a vapor mixture 232a comprising $XeF_2$, $NH_3$ and $H_2$ at a first temperature (step 112 in FIG. 1).

While the mechanism of the reaction does not affect the scope of the claims, it is believed that the vapor phase etching process is a multiple step process. For a first step, a blanket adsorbed reactant film 232b of the vapor mixture 232a comprising $XeF_2$, $NH_3$ and $H_2$ may be formed over the surface of the S/D recess 228, a surface of gate electrode layer 224, and surfaces of the dielectrics comprising the spacer 226 and STI region 218 in the reaction chamber, as schematically illustrated in FIG. 9. In some embodiments, the first step using the vapor mixture 232a is performed at a pressure between about 10 mTorr and about 25 mTorr and at a first temperature between about 20° C. and about 100° C.

For a second step, the adsorbed reactant film 232b may react with an exposed surface of the recessed substrate 202 (i.e., the top surface of the S/D recess 228) in contact therewith to form a condensed and solid reaction product 234 beneath the adsorbed reactant film 232b (shown in FIG. 9). Further, the adsorbed reactant film 232b may react less or not at all with the surfaces of the gate electrode layer 224, spacer 226 and STI region 218 in contact therewith beneath the adsorbed reactant film 232b.

Next, the structure of FIG. 10 is produced by heating the substrate 202 to a second higher temperature to form the S/D cavity 236 extending below the spacer 226 (step 114 in FIG. 1). In some embodiments, the substrate 202 may be heated to a second higher temperature between about 120° C. to about 200° C. while sublimation products of the solid reaction product 234 and the adsorbed reactant film 232b may be pumped out from the reaction chamber. In some embodiments, the substrate 202 may be heated to a second higher temperature between about 120° C. to about 200° C., while flowing a carrier gas over the substrate 202 to remove sublimation products of the solid reaction product 234 and the adsorbed reactant film 232b from the reaction chamber. The carrier gas can be any inert gas. In some embodiments, the carrier gas comprises $N_2$, He, or Ar.

In some embodiments, the substrate 202 is transferred into a heated chamber that is heated to a second higher temperature between about 120° C. to about 200° C. while sublimation products of the solid reaction product 234 and the adsorbed reactant film 232b may be pumped out from the heated chamber. In some embodiments, the substrate 202 is transferred into a heated chamber that is heated to a second higher temperature between about 120° C. to about 200° C., while flowing a carrier gas over the substrate 202 to remove sublimation products of the solid reaction product 234 and the adsorbed reactant film 232b from the heated chamber. The carrier gas can be any inert gas. In some embodiments, the inert gas includes $N_2$, He, and Ar.

This reaction proceeds until the solid reaction product 234 and adsorbed reactant film 232b are removed. The vapor mixture 232a etches the exposed substrate 202 so that little or none of the gate electrode layer 224, spacer 226 and STI region 218 is removed. Accordingly, at the end of the vapor phase etching process, the vapor phase etching process may remove an exposed portion of the substrate 202 to form the S/D cavity 236 extending below the spacer 226 (and below the major surface 202s). In other words, the cavity 236 comprises a portion extending below the spacer 226. In some embodiments, the S/D cavity 236 comprises a portion extending below the gate stack 220 (not shown). In some embodiments, a second height $H_2$ between the major surface 202s of the substrate 202 and a bottom surface 236b of the cavity 236 is in the range of about 30 nm to about 60 nm. In some embodiments, the second height $H_2$ is greater than the first height $H_1$.

Referring to FIG. 11 and step 116 in FIG. 1, after the formation of the S/D cavity 236 extending below the spacer 226, the structure in FIG. 11 is produced by selectively growing a S/D extension 230 partially filling in the S/D cavity 236, wherein the S/D extension 230 comprises a portion extending below the spacer 226 and substantially vertical to the major surface 202s. In some embodiments, a second thickness $t_2$ of the S/D extension 230 is less than or equal to the first thickness $t_1$ of the spacer 226. In some embodiments, a ratio of the second thickness $t_2$ to the first thickness $t_1$ is from 0.1 to 1.

In some embodiments for an n-type FinFET, the N_S/D extension 230 comprises SiP or SiCP. In the depicted embodiment, a pre-cleaning process may be performed to clean the S/D cavity 236 with HF or other suitable solution. Then, the N_S/D extension 230 such as SiCP is selectively grown by an LPCVD process to partially fill the S/D cavity 236. In the depicted embodiment, the LPCVD process is performed at a temperature of about 400 to about 800° C. and under a pressure of about 1 to 15 Torr, using $SiH_4$, $CH_3SiH_3$, $PH_3$, and $H_2$ as reaction gases. Adjusting $PH_3$ partial pressure may control phosphorous doping concentration of the NS/D extension 230. In some embodiments, the N_S/D extension 230 comprises a first activated phosphorous doping concentration ranging from about $5*10^{19}$ to $8*10^{20}$ atoms/cm$^3$.

As compared with implanted LDD region, the N_S/D extension 230 with higher activated dopant concentration may provide lower resistance. Further, the N_S/D extension 230 with uniform dopants distribution may reduce fluctuation of FinFET characteristics. Thus, Applicant's method may achieve the device performance characteristics, such as breakdown effect and leakage.

In some embodiments for a p-type FinFET, the P_S/D extension 230 comprises SiGeB. In the depicted embodiment, a pre-cleaning process may be performed to clean the S/D cavity 236 with HF or other suitable solution. Then, the P_S/D extension 230 such as SiGeB is selectively grown by an LPCVD process to partially fill the S/D cavity 236. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases. Adjusting $B_2H_6$ partial pressure may control boron doping concentration of the P_S/D extension 230. In some embodiments, the P_S/D extension 230 comprise a first activated boron doping concentration ranging from about $5*10^{19}$ to $2*10^{20}$ atoms/cm$^3$.

As compared with implanted LDD region, the P_S/D extension 230 may provide higher stress to channel region. Further, the P_S/D extension 230 with uniform dopants distribution may reduce fluctuation of FinFET characteristics. Thus, Applicant's method may achieve the device performance characteristics, such as breakdown effect and leakage.

Figure 12:
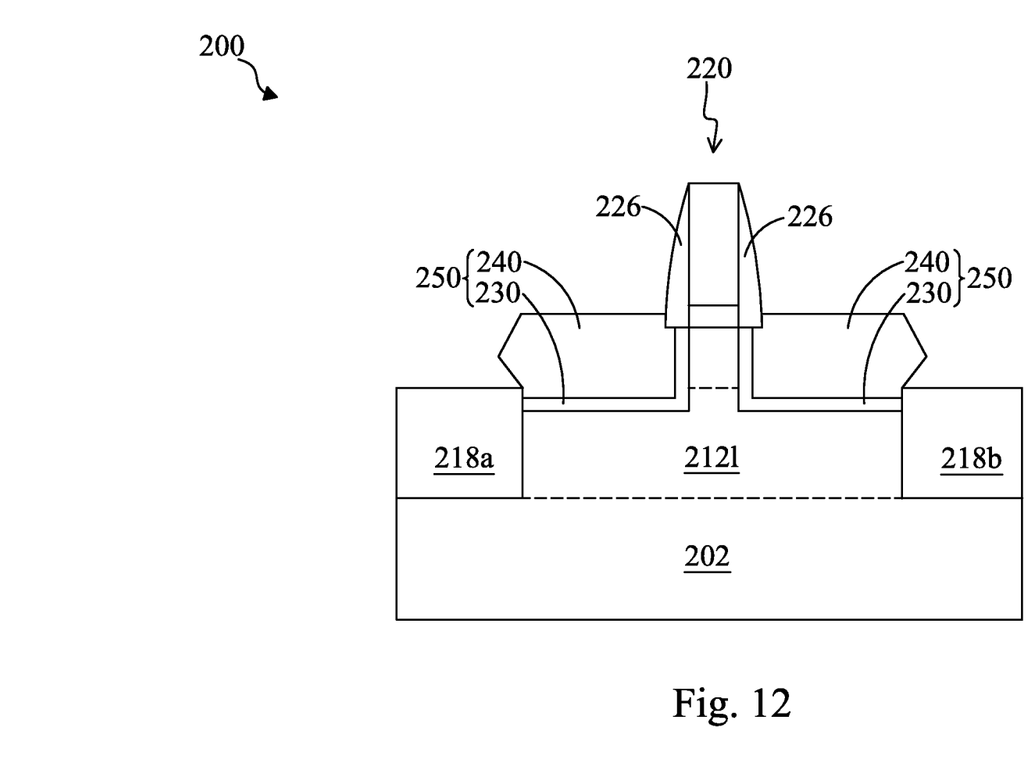

Referring to FIG. 12 and step 118 in FIG. 1, subsequent to the formation of the S/D extension 230 in the S/D cavity 236, the structure in FIG. 12 is produced by selectively growing a strained material 240 filling in the S/D cavity 236, wherein a lattice constant of the strained material 240 is different from a lattice constant of the substrate 202. In the depicted embodiment, the strained material 240 extends above the major surface 202s of the substrate 202, although it may be coplanar with or lower than the major surface 202s. In other words, the strained material 240 does not extent above the major surface 202s of the substrate 202.

In some embodiments for an n-type FinFET, the N_strained material 240 comprises SiP or SiCP. In the depicted embodiment, the N_strained material 240 such as SiCP is selectively grown by an LPCVD process to fill the S/D cavity 236. In the depicted embodiment, the LPCVD process is performed at a temperature of about 400 to 800° C. and under a pressure of about 1 to 100 Torr, using $SiH_4$, $CH_4$, $PH_3$, and $H_2$ as reaction gases. Adjusting $PH_3$ partial pressure may control phosphorous doping concentration of the N_strained material 240. In some embodiments, the N_strained material 240 comprises a second phosphorous doping concentration ranging from about $1*10^{18}$ to $3*10^{21}$ atoms/cm$^3$.

In some embodiments for a p-type FinFET, the P_strained material 240 comprises SiGeB. In the depicted embodiment, the P_strained material 240 such as SiGeB is selectively grown by an LPCVD process to fill the S/D cavity 236. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases. Adjusting $B_2H_6$ partial pressure may control boron doping concentration of the P_strained material 240. In some embodiments, the P_strained material 240 comprise a second boron doping concentration ranging from about $1*10^{18}$ to $1*10^{21}$ atoms/cm$^3$.

In some embodiments, the S/D extension 230 and the strained material 240 are combined and referred to as the S/D structure 250. In some embodiments, the S/D structure 250 is distributed between the gate stack 220 and the STI region 218. In some embodiments, the S/D extension 230 is disposed between the substrate 202 and strained material 240. In some embodiments, the first doping concentration of the S/D extension 230 is less than the second doping concentration of the strained material 240. In some embodiments, a ratio of the first concentration to the second concentration is from 0.01 to 0.1.

After the steps shown in FIG. 1, as further illustrated with respect to the example depicted in FIGS. 2-12, have been performed, subsequent processes, comprising interconnect processing, are typically performed to complete the semiconductor device 200 fabrication.

In accordance with one embodiment, a field effect transistor comprises a substrate comprising a major surface and a cavity below the major surface; a gate stack on the major surface of the substrate; a spacer adjoining one side of the gate stack; a shallow trench isolations (STI) region disposed on the side of the gate stack, wherein the STI region is within the substrate; and a source/drain (S/D) structure distributed between the gate stack and STI region, wherein the S/D structure comprises a strained material in the cavity, wherein a lattice constant of the strained material is different from a lattice constant of the substrate; and a S/D extension disposed between the substrate and strained material, wherein the S/D extension comprises a portion extending below the spacer and substantially vertical to the major surface.

In accordance with another embodiments, a method of fabricating a field effect transistor comprises providing a substrate comprising a major surface; forming a shallow trench isolation (STI) region within the substrate; forming a gate stack adjacent to the STI region on the major surface of the substrate; forming a spacer adjoining one side of the gate stack; recessing the substrate to form a source/drain (S/D) recess adjacent to the spacer; exposing a surface of the S/D recess to a vapor mixture comprising $XeF_2$, $NH_3$ and $H_2$ at a first temperature; heating the substrate to a second higher temperature to form a S/D cavity extending below the spacer; selectively growing a S/D extension partially filling in the S/D cavity; and selectively growing a strained material filling in the S/D cavity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a field effect transistor comprising:
   providing a substrate comprising a major surface;
   forming a shallow trench isolation (STI) region within the substrate;
   forming a gate stack adjacent to the STI region on the major surface of the substrate;
   forming a spacer adjoining at least one side of the gate stack;
   recessing the substrate to form a source/drain (S/D) recess adjacent to the spacer;
   exposing a surface of the S/D recess to a vapor mixture comprising $XeF_2$, $NH_3$ and $H_2$ at a first temperature;
   ceasing to expose the surface of the S/D recess to the vapor mixture;
   after the step of ceasing to expose the surface of the S/D recess to the vapor mixture, heating the substrate to a second higher temperature to form a S/D cavity extending below the spacer;
   selectively growing a S/D extension partially filling in the S/D cavity; and
   selectively growing a strained material filling in the S/D cavity.

2. The method of claim 1, wherein the step of exposing a surface of the S/D recess to a vapor mixture comprising $XeF_2$, $NH_3$ and $H_2$ at a first temperature is performed at a temperature between about 20° C. and about 100° C.

3. The method of claim 1, wherein the step of heating the substrate to a second higher temperature is performed at a temperature is between about 120° C. to about 200° C.

4. The method of claim 1, wherein the step of recessing the substrate to form a source/drain (S/D) recess adjacent to the spacer is performed using an anisotropic plasma etching process.

5. The method of claim 1, wherein the step of selectively growing a S/D extension partially filling in the S/D cavity is performed using an LPCVD process.

6. The method of claim 5, wherein the S/D extension is SiCP and the LPCVD process is performed at a temperature of about 400 to about 800° C. and under a pressure of about 1 to about 100 Torr, using $SiH_4$, $CH_3SiH_3$, $PH_3$, and $H_2$ as reaction gases.

7. The method of claim 5, wherein the S/D extension is SiGeB and the LPCVD process is performed at a temperature of about 400 to about 800° C. and under a pressure of about 1 to about 200 Torr, using $SiH_2Cl_2$, $SiH_4$, $GeH_4$, $HCl$, $B_2H_6$, and $H_2$ as reaction gases.

8. The method of claim 1, wherein the step of selectively growing a strained material filling in the S/D cavity is performed using an LPCVD process.

9. A method for fabricating a field effect transistor comprising:
   forming a fin extending from a major surface of a substrate;
   forming a dielectric layer surrounding the fin;
   recessing a top surface of the dielectric layer so that the top surface of the fin extends above the top surface of the dielectric layer;
   forming a patterned gate stack extending over a portion of the top surface of the fin and extending along sidewalls of the fin, the gate stack extending laterally in a first direction and the fin extending laterally in a second direction orthogonal to the first direction;
   forming a spacer adjacent at least one sidewall of the gate stack;
   using the gate stack and the spacer as a mask, recessing a portion of the fin to form a source/drain (S/D) recess adjacent the spacer, the S/D recess having a recess sidewall and a recess bottom;
   vapor phase etching the recess sidewall and the recess bottom by exposing the recess sidewall and the recess bottom to a vapor mixture comprising XeF2, NH3 and H2 at a first temperature;
   ceasing the vapor phase etching;
   after ceasing the vapor phase etching, extending the S/D recess under the spacer by heating the substrate to a second higher temperature;
   selectively growing a S/D extension on the recess sidewall and the recess bottom; and
   selectively growing a strained material on the S/D extension and filling the S/D recess.

10. The method of claim 9, wherein the step of vapor phase etching the recess sidewall and the recess bottom includes:
    forming an adsorbed reactant film on the recess sidewall and the recess bottom and on the gate stack and on the recessed top surface of the dielectric layer; and
    reacting the recess sidewall and the adsorbed reaction film and reacting the recess bottom and the adsorbed reacting film to form a condensed reaction product beneath the adsorbed reactant film extending into the recess sidewall and the recess bottom, respectively.

11. The method of claim 10, wherein the step of extending the S/D recess under the spacer by heating the substrate to a second higher temperature includes:
    sublimating and removing the condensed reaction product.

12. The method of claim 9 wherein the fin extends from the major surface of the substrate in a first direction, and wherein the step of selectively growing a S/D extension on the recess sidewall and the recess bottom produces a portion of the S/D extension extending substantially in the same direction under the gate stack.

13. The method of claim 9 wherein the step of vapor phase etching the recess sidewall and the recess bottom includes etching at a pressure of from about 10 mTorr to about 25 mTorr and at a temperature of from about 20° C. to about 100° C.

14. The method of claim 9 wherein the strained material is epitaxially grown to extend over a portion of the dielectric layer.

15. The method of claim 9 wherein the step of selectively growing a S/D extension includes a Low Pressure Chemical Vapor Deposition (LPCVD) process performed at a temperature of about 400 to about 800° C. and under a pressure of about 1 to about 100 Torr, using $SiH_4$, $CH_3SiH_3$, $PH_3$, and $H_2$ as reaction gases.

16. The method of claim 9, wherein the step of selectively growing a S/D extension includes a Low Pressure Chemical Vapor Deposition (LPCVD) process performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

17. A method for fabricating a field effect transistor comprising:
   recessing a top surface of a semiconductor substrate for form a fin extending therefrom;
   forming a shallow trench isolation (STI) region surrounding the fin;
   recessing the STI region to expose a sidewall portion of the fin and so that the top surface of the fin extends above a top surface of the STI region;
   forming a patterned gate stack extending over a portion of the top surface of the fin;
   forming a spacer adjacent at least one sidewall of the gate stack;
   recessing a portion of the fin to expose a sidewall portion of the fin, the sidewall being substantially aligned with the spacer;
   forming a reactant film lining the sidewall portion of the fin;
   reacting the reactant film with the sidewall portion of the fin to convert a region of the sidewall portion of the fin to a form a condensed reaction product, the condensed reaction product extending beneath the spacer;
   removing the condensed reaction product to create a cavity extending under the spacer; and forming a source/drain extension in the cavity.

18. The method of claim 17, wherein the step of forming a reactant film lining the sidewall portion of the fin includes vapor phase etching the sidewall portion of the fin with a vapor mixture comprising $XeF_2$, NH3 and $H_2$ at a first temperature.

19. The method of claim 18, wherein the step of removing the condensed reaction includes heating the fin to a second temperature, higher than the first temperature.

20. The method of claim 17, wherein the step of forming a source/drain extension in the cavity includes selectively epitaxially growing the source/drain extension on exposed regions of the fin.

* * * * *